Feb. 5, 1952 H. G. FISHER 2,584,796

STABILIZED OSCILLATOR

Filed June 4, 1947 2 SHEETS—SHEET 1

INVENTOR.

HAROLD G. FISHER

BY Harry Tunick

ATTORNEY

Feb. 5, 1952 H. G. FISHER 2,584,796

STABILIZED OSCILLATOR

Filed June 4, 1947 2 SHEETS—SHEET 2

INVENTOR.
HAROLD G. FISHER

BY Larry G. Grover
ATTORNEY

Patented Feb. 5, 1952

2,584,796

UNITED STATES PATENT OFFICE 2,584,796

STABILIZED OSCILLATOR

Harold G. Fisher, San Diego, Calif., assignor to Radio Corporation of America, a corporation of Delaware Application June 4, 1947, Serial No. 752,432

11 Claims. (Cl. 250—36)

The present invention relates to oscillators and more particularly to high frequency oscillators adapted for use in conjunction with frequency changer circuits of high frequency receivers.

An object of the present invention is the provision of an oscillator which will not drift beyond permissible limits in its frequency due to heating effects.

Another object of the present invention is the provision of a stabilized local oscillator especially adapted for FM receivers operating on frequencies of the order of 100 megacycles.

Still another object of the present invention is the provision of an oscillator arrangement for high frequency receivers which will avoid the necessity of repeatedly retuning the receiver after it is turned on.

One of the serious problems brought about by the 88 to 106 megacycle band assignment for frequency modulation broadcasting is the design of a stable local oscillator for the receivers to be operated with such broadcasting arrangements. Experiments have shown that local oscillators for frequency modulation receivers constructed according to what was previously considered good practice were found to have excessive warm-up drifts of the order of 50 to 100 kilocycles during the first five minutes. However, a maximum drift of the order of 10 kilocycles for the same time period can be tolerated or permitted to avoid distortion and to avoid the necessity of retuning. I have made a thorough investigation of the factors which cause drift in small local oscillators for high frequency receivers and have found that the stability of the oscillator may be improved by taking the following precautions:

1. It is desirable to use a stable tank capacitor having a zero coefficient of capacity with change in temperature and a tolerance of ±5 parts in a million per degree centigrade.

2. It is desirable to use a tuning inductance made of a copper strap wound under tension or formed by plating on a quartz form. Alternatively a self-supporting silver plated Invar coil anchored at one terminal only may be used.

3. Quartz or other low expansion materials should be used for mounting the components of the oscillator.

4. Silver plated Invar wire or other wire having a zero coefficient of expansion with regard to temperature should be used for wiring.

5. The use of a miniature type triode oscillator tube rather than its full size equivalent is desirable.

6. A low plate voltage should be used. Filament and plate voltages should be maintained constant.

7. Oscillator components should be mounted where they will not receive any substantial amount of heat from other receiver parts.

8. The use of permeability tuning as compared to condenser tuning contributes to the stability of the oscillator.

Finally, even after all of these precautions have been taken, it is found that a substantial amount of drift is caused by the tube itself. This drift may be compensated for by locating, closely adjacent to the tube, a negative coefficient condenser or a tube shield which changes shape on heating in such a manner as to decrease the capacity across the tuned circuit. The negative coefficient condenser, if used, may be a separate condenser soldered as near the tube pins themselves as possible or the tube socket itself may be made of ceramic having a negative dielectric coefficient with regard to temperature, the socket terminals themselves acting as the plates of the condenser.

The present invention will be more fully understood by reference to the following detailed description which is accompanied by a drawing in which:

Figure 2 illustrates in perspective an embodiment of the present invention, while Figure 3 illustrates a modification thereof, and Figure 4 a further modification, while

Figure 1:
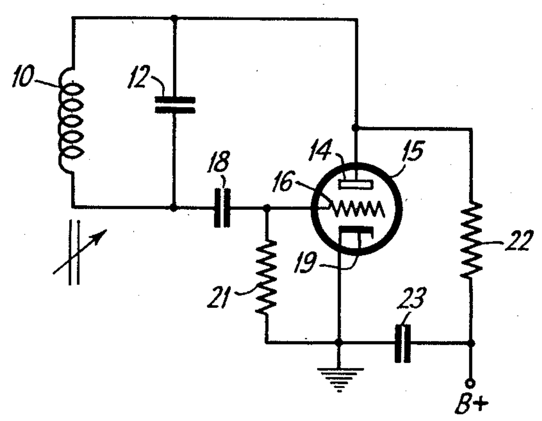
Figure 1 illustrates in diagrammatic form a typical oscillator circuit upon which the principles of the present invention may be practiced.

Referring now to Figure 1 illustrating a circuit diagram of an oscillator investigated, reference numeral 10 indicates the tuning inductance. The effective inductance may be varied by inserting a powdered iron core or a brass slug into the turns of the coil. Across inductance 10 is connected a tank condenser 12, preferably a condenser having a ceramic dielectric and especially chosen for its low temperature coefficient.

In order to utilize permeability tuning the oscillator coil 10 should be untapped. Therefore, a Colpitts type of oscillator circuit is used with plate 14 of oscillator tube 15 directly connected to one end of inductance 10 and grid 16 coupled through grid condenser 18 to the other end. The amount of excitation applied to tube 15 depends upon the ratio of the input and output capacitances of the tube. Such construction eliminates not only the tapped inductance coil but also one condenser. In this way, the compensation problem is simplified. Cathode 19 of tube 15 is directly grounded and grid 16 is connected to ground through grid leak 21. Anode potential for the oscillator tube 15 is supplied from the terminal marked B+ through the plate dropping resistor 22. The source of anode potential may, if necessary, be by-passed by condenser 23.

As mentioned above, I have found that even after all sources of frequency drift in the circuit elements connected to tube 15 have been eliminated or compensated for, it is found that tube 15 itself is a substantial cause of warm-up drift in oscillators operating at frequencies ranging from 80 to 120 megacycles. It has been found that miniature tubes such as the 6C4 warm up more rapidly and cause less frequency shift than standard size tubes operating under the same conditions.

In practicing the present invention, it is preferred to use only a single compensating means and make every other part of the circuit as stable as possible because of the difficulty of producing the proper amount of compensation at the correct time under the wide range of operating conditions such as the ambient temperature, line voltage, variations in setting of the tuning condenser, if used, etc. Compensation of the tube shift alone is preferable since it can naturally be performed by an element which is to be heated by the tube. A proper design of this compensation will reduce the total oscillator warm-up drift to a much smaller value than that contributed by the tube alone.

Figure 2:
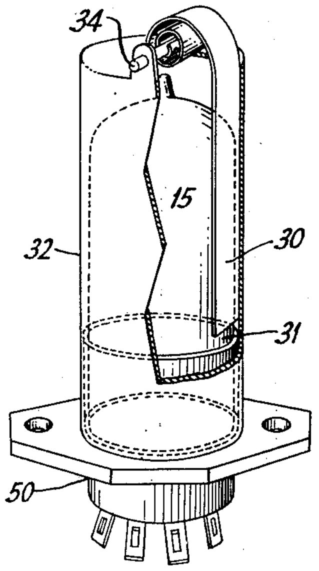

The compensation according to the principles of the invention may be performed in several different ways. The first type of tube shield compensation illustrated in Figure 2 makes use of bi-metallic strip 30 arranged in a slot 31 cut in the tube shield 32. The bi-metallic strip is curled into a spiral about an axle 34 secured to the top end of tube shield 32 and in electrical contact therewith. The tube shield 32 being grounded, it together with the elements within tube 15, forms a capacity effectively in shunt to the tuning inductance 10 (Figure 1). The amount of this capacity is varied by the position of the bi-metallic strip 30 where it passes along the side of tube 15. As the tube heats up the tube shield 32 and the bi-metallic strip are both heated by the heat generated in the tube and due to the bi-metallic construction of strip 30, it is caused to bend away from tube 15 and thus decrease the effective capacity across inductance 10. Thus, the tube drift may be substantially entirely compensated for.

Figure 3:
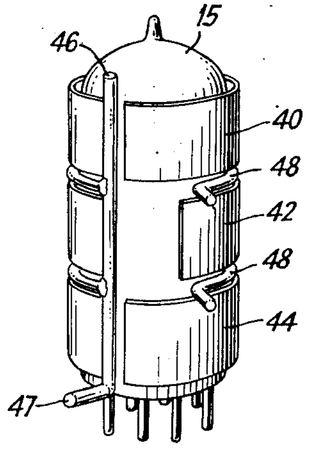

A modified form of the present invention is shown in Figure 3 wherein bi-metallic strips 40, 42 and 44 are wrapped horizontally around tube 15 thereby being made substantially directly responsive to the temperatures generated by the tube. The bi-metallic strips 40, 42 and 44 are each at one end secured to a supporting rod 46 having a lug portion 47 whereby the entire assembly may be grounded to the chassis of the receiver thus forming a shield for tube 15. The relative positions of the tube 15 and the tube shield is maintained by spring clips 48 encircling tube 15 and secured to the supporting rod 46. As the tube 15 warms up, the bi-metallic strips 40, 42 and 44 receive heat substantially directly from the tube and tend to curl outward, thus decreasing the capacity between the tube shield and the elements within tube 15. The effective capacity across the tuning inductance is thus decreased.

Figures 4, 5:
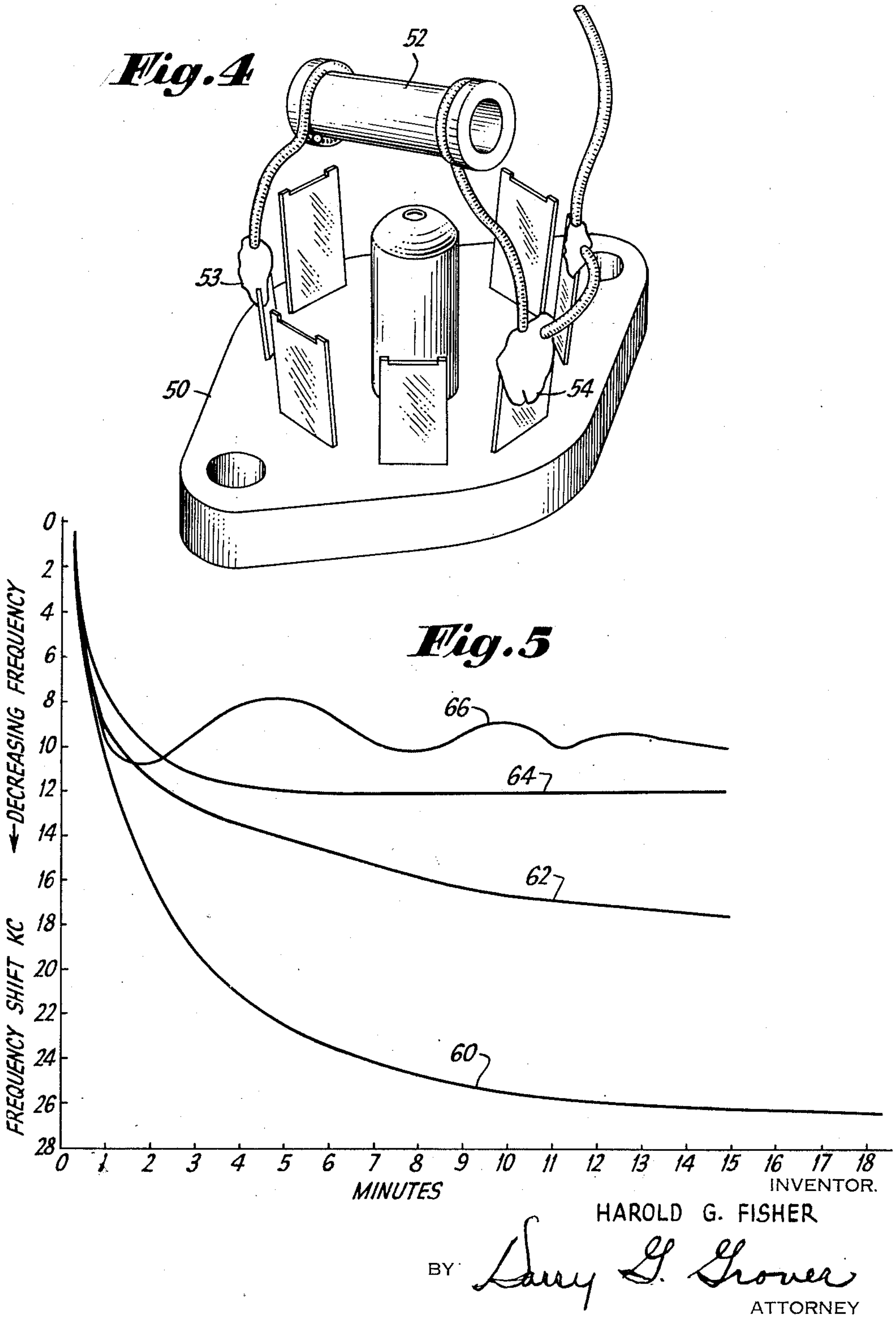
Figure 5 is a family of curves illustrating the compensating effect obtained by the application of the principles of the invention.

A third method of compensation is shown in Figure 4 wherein tube socket 50 has a negative coefficient tank condenser 52 soldered directly to the socket lugs 53 and 54 as close as possible to the socket itself. Due to the comparatively large size of the tube pins with regard to the size of the tube elements themselves, the socket terminals 53 and 54 heat up nearly as rapidly as the tube itself heats up. The condenser being closely adjacent the heat conducted from the socket terminals 53, 54 and in good thermal, as well as electrical, contact therewith, terminals 53 and 54 affect the capacity of condenser 52 to such an extent that the drift of the tube is compensated for. The socket dielectric material being a poor heat conductor very little heat is lost directly to the chassis and condenser 52 follows the heating cycle of tube 15 closely. Therefore, a small value of capacitance for condenser 52 is capable of providing substantial compensation for frequency shift due to the temperature coefficient of capacity of the tube itself.

In addition to the thermally responsive condenser 52 of Figure 4 or instead of this condenser the insulation of socket 50 may be made of titanium dioxide or other insulating material having a negative temperature coefficient. The socket clips 53, 54 then act as plates of a condenser, the insulating material acting as the dielectric thereof. In order to obtain the correct coefficient of capacity with regard to temperature, magnesium titanate may be added to the titanium dioxide to increase the negative coefficient or magnesium or aluminium dioxide to decrease the negative coefficient.

The curves of Figure 5 illustrate the effectiveness of the compensation obtained by the methods described above. In this figure the freqency shift in kilocycles is plotted as ordinates while the time of operation in minutes is plotted as abscissae. Curve 60 illustrates the drift of the oscillator circuit of Figure 1 with no compensation applied. Curve 62 illustrates the reduced amount of drift obtained when a bimetallic sleeve arrangement such as shown in Figure 3 is utilized for reducing the tube shift. Curve 64 shows the effectiveness of the negative coefficient tank condenser 52 of Figure 4 in reducing the frequency shift, while curve 66 illustrates the compensation obtained by the use of the bimetallic spiral leaf insert in the tube shield of Figure 2. While the curve 66 is not a straight line, the small hills and valleys therein represent comparatively small frequency variation. The total overall shift in frequency with time is maintained well within the desired operating tolerances.

While I have illustrated a particular embodiment of the present invention, it should be clearly understood that it is not limited thereto since many modifications may be made in the several elements employed and in their arrangement and it is therefore contemplated by the appended claims to cover any such modifications as fall within the spirit and scope of the invention.

What is claimed is:

1. In an arrangement including a resonant circuit coupled to a discharge tube and characterized in that the resonant frequency thereof is responsive to changes in temperature of said tube, a thermally responsive condenser coupled to said circuit and responsive to heat developed by said tube, said condenser having a temperature-capacity characteristic opposing that of said tube, said condenser including as one of its electrodes the elements within said tube, the other of its electrodes being a bi-metallic strip of metal forming at least a part of a shield for said tube.

2. In an arrangement including a resonant circuit coupled to a discharge tube and characterized in that the resonant frequency thereof is responsive to changes in temperature of said tube, a thermally responsive condenser coupled to said circuit and responsive to heat developed by said tube, said condenser having a temperature-capacity characteristic opposing that of said tube, said condenser including as one of its electrodes a grounded shield over said tube, a bi-metallic strip of metal in one side of said shield, said strip being arranged to bend away from said tube with an increase in the temperature of said tube.

3. In a stabilized oscillator including a resonant circuit coupled to a discharge tube wherein the operating frequency drifts as said tube warms up, a thermally responsive condenser coupled to said circuit and so arranged as to be affected by heat from said tube, said condenser having a temperature-capacity characteristic opposing that of said tube, said condenser including as one of its electrodes the elements within said tube, the other of its electrodes being a bi-metallic strip of metal forming a shield for said tube.

4. In a stabilized oscillator including a resonant circuit coupled to a discharge tube wherein the operating frequency drifts as said tube warms up, a thermally responsive condenser coupled to said circuit and so arranged as to be affected by heat from said tube, said condenser having a temperature-capacity characteristic opposing that of said tube, said condenser including a shield can over said tube, a metallic-strip of metal in one side of said can, said strip being arranged to bend away from said tube with an increase in temperature of said tube.

5. In a stabilized oscillator including a resonant circuit adapted to be coupled to a discharge tube and wherein the operating frequency tends to drift as said tube warms up, a condenser having a negative capacity-temperature characteristic coupled to said circuit and in close proximity to said tube whereby it is affected by the temperature of said tube, said condenser being separate and apart from the constituent elements of said tube.

6. A stable oscillator arrangement including a resonant circuit adapted to be coupled to a discharge tube, said resonant circuit including inductance and capacitance elements substantially unaffected by temperature variations whereby frequency drift with temperature variations is substantially entirely caused by capacitance changes in said tube including a close fitting shield about said tube, said shield having bi-metallic leaves so arranged as to bend away from said tube under the influence of heat.

7. In a stabilized oscillator including a resonant circuit coupled to a discharge tube and wherein the operating frequency tends to drift as said tube warms up, a thermally responsive condenser coupled to said circuit and so arranged as to be affected by heat from said tube, said condenser having a temperature-capacity characteristic of opposite sign to that of said tube, said condenser comprising apparatus separate and apart from the necessary elements of said tube and including a pair of electrodes coupled to the base pins of said tube and a dielectric between said electrodes having a negative dielectric constant characteristic with regard to temperature, said dielectric being a portion of the socket for mounting said tube.

8. In an arrangement including a resonant circuit coupled to a discharge tube and wherein the resonant frequency thereof is responsive to changes in temperature of said tube, a thermally responsive condenser separate and apart from the necessary elements of said tube coupled to said circuit and responsive to heat developed by said tube, said condenser having a temperature-capacity characteristic of opposite sign to that of said tube, said condenser being bridged across the insulation of a socket adapted to receive said tube.

9. A temperature compensated electron discharge device subject to varying operating conditions in response to varying temperatures, said device having a socket of dielectric material adapted to be heated as said device becomes heated, terminals secured to said socket in thermal association with said socket, and a thermally responsive condenser having a negative temperature coefficient connected directly across said terminals at points in close proximity to said socket.

10. A temperature compensated device subject to varying operating conditions in response to varying temperatures, said device having a socket made of dielectric material having a negative temperature coefficient, a pair of metallic lugs embedded in said socket and adapted to become heated as said device and socket becomes heated, and a thermally responsive condenser of a relatively small value of capacitance directly connected across said lugs and in close proximity to said socket, said condenser also having a negative temperature coefficient.

11. In a temperature compensated electron tube oscillator wherein the frequency drifts as the tube warms up, said tube having a socket of dielectric material and a pair of physically spaced metallic pins inserted into said socket, a thermally responsive condenser having electrodes connected to said pins and arranged to be affected by the heat from said tube, said condenser being in close proximity to said socket and having a temperature-capacity characteristic of opposite sign to that of said tube.

H. G. FISHER.

REFERENCES CITED

The following references are of record in the file of this patent:

UNITED STATES PATENTS

| Number | Name | Date |
|---|---|---|
| 1,690,676 | Gilling | Nov. 6, 1928 |
| 2,027,521 | Drake | Jan. 14, 1936 |
| 2,144,009 | Barber | Jan. 17, 1939 |
| 2,160,478 | Laico | May 30, 1939 |
| 2,235,816 | Freeman | Mar. 25, 1941 |
| 2,371,790 | Bell | Mar. 20, 1945 |
| 2,445,256 | Page et al. | July 13, 1948 |